United States Patent

Solomon et al.

[15] 3,684,974

[45] Aug. 15, 1972

[54] AUTOMATIC GAIN CONTROL RF-IF AMPLIFIER

[72] Inventors: James E. Solomon, Scottsdale; Walter Richard Davis, Phoenix, both of Ariz.

[73] Assignee: Motorola, Inc., Franklin Park, Ill.

[22] Filed: Jan. 29, 1968

[21] Appl. No.: 701,368

[52] U.S. Cl. ....................... 330/30 D, 330/16, 330/26

[51] Int. Cl. ................................................. H03f 2/68

[58] Field of Search ........................ 330/30 D; 329/50

[56] References Cited

UNITED STATES PATENTS 3,241,078 3/1966 Jones ........................... 329/50

*Primary Examiner*—Nathan Kaufman
*Attorney*—Mueller & Aichele

[57] ABSTRACT

Disclosed is a differential amplifier circuit featuring electronic gain control, and this circuit may be constructed in monolithic integrated form. In one embodiment of the invention, first and second pairs of differentially coupled transistors are connected respectively to first and second differentially coupled input transistors, and the input transistors are connectable to a source of differential input signals. Differential output signals are derived at the outputs of transistors in each of the pairs of transistors, and by applying an automatic gain control (AGC) signal at a node which is common to the transistor pairs, electronic gain control is obtained without a differential signal arising therefrom. In another embodiment of the invention, an output differential amplifier stage is directly coupled to transistors in the first and second pairs of transistors so that any common mode signal present there is rejected in said output stage.

8 Claims, 5 Drawing Figures

INVENTORS
Walter Richard Davis
James E. Solomon

BY Mueller, Aichele & Rauner

ATTY'S.

INVENTORS
Walter Richard Davis
James E. Soloman
BY Mueller, Aichele & Rauner
ATTYS.

AUTOMATIC GAIN CONTROL RF-IF AMPLIFIER

BACKGROUND OF THE INVENTION

This invention relates generally to differential amplifiers and more particularly to a new and improved solid-state RF-IF differential amplifier featuring electronic gain control, constant input and output admittance with AGC, and wide bandwidth.

Electronic gain control in prior art solid-state amplifiers has been achieved either by shifting the DC operating point of one or more transistor stages (forward or reverse AGC) of the amplifier or by employing diode attenuators between stages. The former approach has the disadvantage that both the input and output impedances of a transistor change with emitter current, thus resulting in undesirable shifts in the bandpass characteristic as AGC is applied. Diode attenuator networks can be designed to minimize impedance shifts, but these networks are difficult to construct in monolithic integrated form because they cannot be DC coupled.

SUMMARY OF THE INVENTION

An object of the present invention is to provide a new and improved differential amplifier which overcomes the above prior art limitations and which is particularly suitable for monolithic fabrication.

Another object of this invention is to provide an electronic gain control amplifier stage requiring no bypass capacitors for decoupling transistors in the amplifier.

Another object of this invention is to provide a differential amplifier of the type described which will have constant input and output impedance as the AGC signal is varied.

A further object of this invention is to provide a differential amplifier of the type described which may be fabricated using known NPN semiconductor processing technology.

Briefly described, the present invention features a differential amplifier having first and second differentially coupled transistor pairs connected to a common node at which an automatic gain control voltage is applied. First and second differentially coupled input transistors are connected respectively to the first and second transistor pairs so that differential signals applied to the first and second input transistors will control the current in the transistor pairs. Any common mode signals which are coupled to the transistor pairs are therefore rejected when the input stage is differentially coupled to a second or output differential amplifier stage in accordance with one embodiment of this invention.

DESCRIPTION OF THE INVENTION

Figure 1:
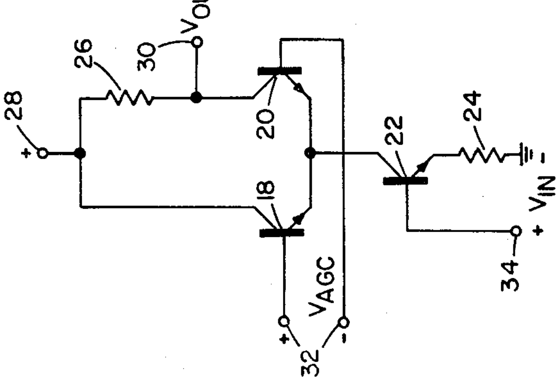
Fig.1 (PRIOR ART)
FIG. 1 is a schematic diagram of a basic gain control differential amplifier stage of the prior art.

Referring to the drawings, there is shown in FIG. 1 a prior art differential amplifier stage including emitter-coupled transistors 18 and 20 which are connected to the collector of an input transistor 22. The collectors of transistors 18 and 20 are coupled to a voltage supply terminal 28, and an output signal proportional to current through load resistor 26 is derived at output terminal 30. The input transistor 22 is connected to ground potential through a current sink resistor 24, and an input signal is applied to terminal 34 at the base of transistor 22.

A significant feature of the prior art circuit in FIG. 1 is that the current through the input transistor 22 remains constant with changes in the automatic gain control voltage (AGC) applied at terminals 32. Thus the input admittance for the circuit does not change with variations in AGC. Because the output current does change with AGC voltage variations, the output admittance is not constant with AGC.

One disadvantage of using the circuit of FIG. 1 is that bypass capacitors (not shown) must be connected at the bases of transistors 18 and 20 in order to provide common base operation therefor. In accordance with the present invention, no such external bypass capacitors are required and this feature will be explained below in detail with reference to the circuits (FIGS. 2, 3, and 4) embodying the present invention.

Figure 2:
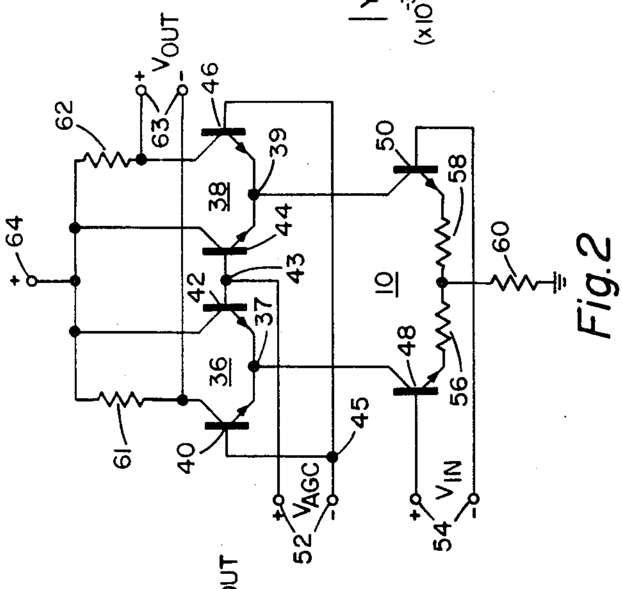
FIG. 2 is a schematic diagram of a differential amplifier circuit according to one embodiment of the present invention.

The differential amplifier circuit in FIG. 2 includes first and second differentially coupled pairs 36 and 38 of transistors which are connected as shown to a source of automatic gain control voltage 52. The first pair 36 includes NPN transistors 40 and 42 which are emitter coupled to the collector of a first input transistor 48 at a first common point 37 and the second pair 38 of transistors includes emitter-coupled NPN transistors 44 and 46 which are connected to the collector of a second input transistor 50 at a second common point 39. Input transistors 48 and 50 are connected via resistors 56 and 58 to a common resistor 60 in a resistive T network, and differential input signals are applied via terminals 54 to the bases of the first and second input transistors 48 and 50. The collectors of transistors 42 and 44 are tied directly to a voltage supply terminal 64, and the collectors of transistors 40 and 46 are connected through load resistors 61 and 62 to the voltage supply terminal 64.

When differential input signals are applied to the bases of transistors 48 and 50, the current flow from the emitter-coupled transistor pairs 36 and 38 is differentially controlled so that a differential output signal is developed across the output terminal 63. Gain reduction is achieved by increasing the control voltage, $V_{AGC}$, which gradually diverts the collector current of the input transistors 48 and 50 through transistors 42 and 44 to ground through the DC supply. Because of the differential connection, the node 43 to which the bases of transistors 42 and 44 are connected, and node 45 to which the bases of transistors 40 and 46 are connected are virtual grounds and therefore require no bypass capacitors.

The input impedances of transistors 48 and 50 are independent of the AGC voltage because the operating point, i.e., emitter current, of these transistors does not change with AGC. A second differential amplifier stage, which will be described below with reference to FIGS. 3 and 4, may be connected to the output terminals 63 and differentially controlled by the signal thereon so that a common mode output voltage shift in the input amplifier stage (FIG. 2) is rejected in the output stage.

Figure 3:
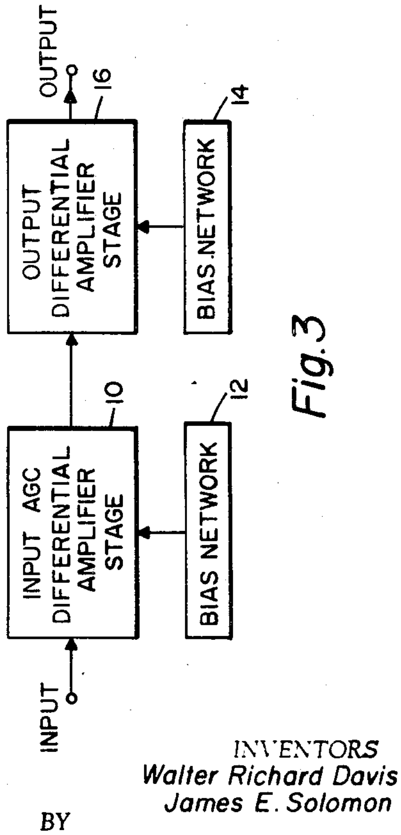
FIG. 3 is a block diagram of another embodiment of the present invention including the combination of input and output differential amplifier stages.
Figure 4:
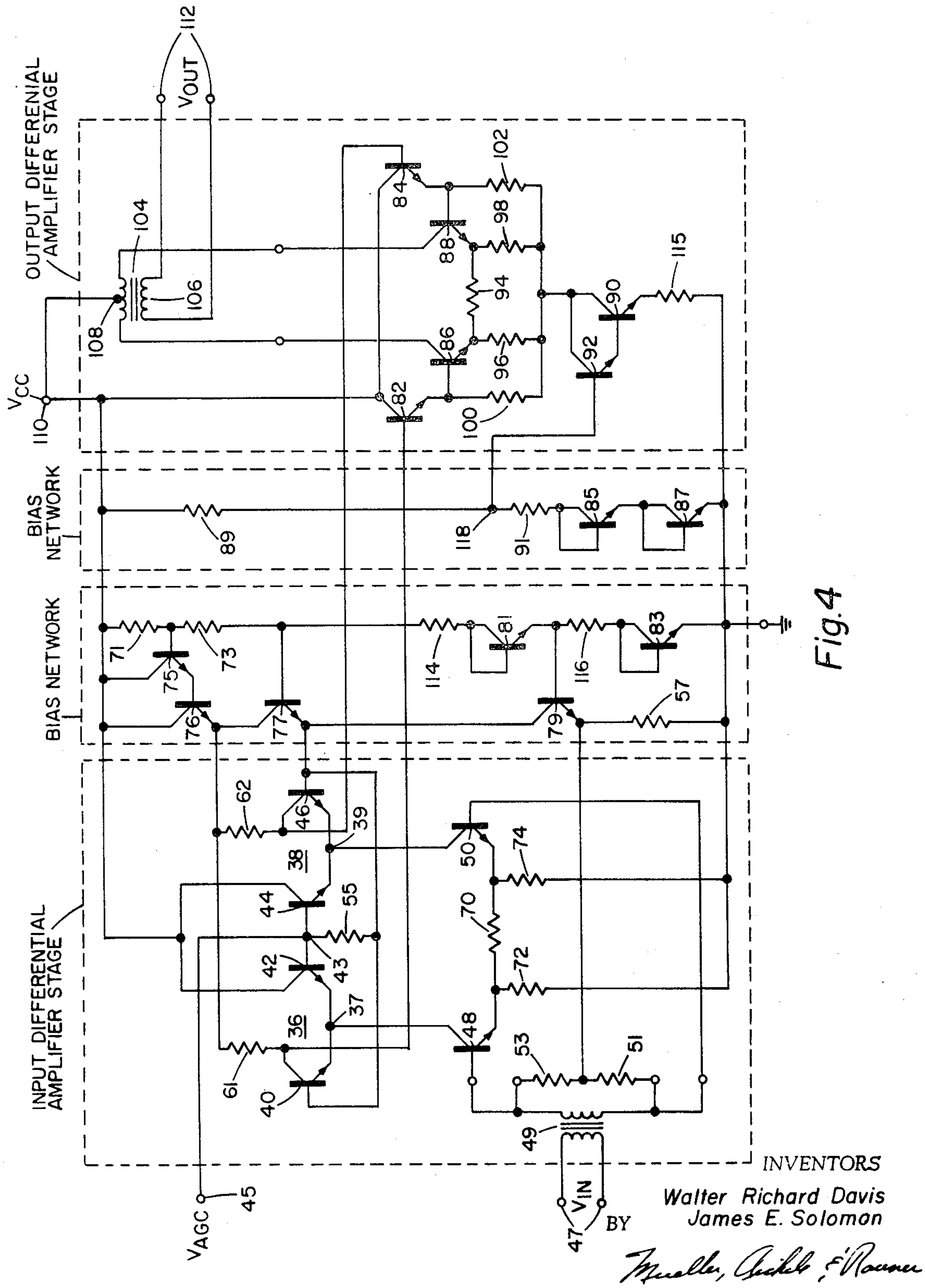
FIG. 4 is a schematic diagram of the circuit illustrated in block diagram in FIG. 3.

Referring now to FIGS. 3 and 4, there is shown an output differential amplifier stage 16 which is DC coupled to the first or input AGC differential amplifier stage 10. First and second bias networks 12 and 14 are connected respectively to the differential amplifier stages 10 and 16 and provide thereat proper DC biasing as will be described further with reference to FIG. 4. In FIG. 4 the first or input AGC differential amplifier stage has been modified somewhat from the circuit shown in FIG. 2 and includes a resistive *pi* network having resistors 70, 72, and 74 connected to the emitters of the first and second input transistors 48 and 50. The bases of transistors 48 and 50 are connected to opposite ends of the secondary winding of the input transformer 49. The input or primary winding of this transformer is coupled to a source of input signals at terminals 47, and resistors 51 and 53 are connected across the transformer 49 and to transistor 79 in a first bias network 12 which establishes the proper DC bias levels at the input transistors 48 and 50.

The bias network 12 includes resistors 71 and 73 to which DC level-shifting transistors 75, 76, and 77 are connected, and network 12 establishes a desired DC biasing level at the first or input differential amplifier stage 10. Diodes 81 and 83 are serially connected as shown in the bias network 12, and resistors 114 and 116 provide desired DC level shifting in the bias network 12. Diodes 81 and 83 provide temperature compensation for the input differential amplifier stage 10 as well as DC level setting therefor. Transistors 75 and 76 serve to bias the collectors of transistors 40 and 46 to prevent these collectors from rising to the supply voltage when transistors 40 and 46 are completely turned off by AGC action. If these collectors were allowed to rise to the supply voltage, this would cause undesired saturation in the second or output differential amplifier stage 16 to be described. Transistor 77 establishes a DC bias at the bases of transistors 40 and 46 in accordance with the desired level of DC base potential for these transistors. Similar DC biasing is provided by transistor 79 in accordance with the desired level of current through transistors 48 and 50 under DC conditions.

A second bias network consisting of resistor 89, resistor 91, diode 85 and diode 87 is connected in a serial manner for the purpose of biasing the second or output differential amplifier stage 16.

Output stage 16 includes first and second differentially coupled transistors 86 and 88 connected to a resistive pi network including resistors 96, 94 and 98. Third and fourth transistors 82 and 84 are cascaded to transistors 86 and 88 in a Darlington-type connection. Emitter-follower resistors 100 and 102 are connected as shown to the emitters of transistors 82 and 84, and a current sink consisting of transistors 90 and 92 provides a path for constant current from the differentially coupled transistors 92, 84, 86, and 88 through resistor 115 to ground. Transistor 92 is biased by the DC voltage at point 118 and diodes 85 and 87 temperature compensate the output differential amplifier stage 16 in a well known manner.

The collectors of transistors 40 and 46 in the input differential amplifier stage 10 are DC connected directly to the third and fourth transistors 82 and 84 in the output differential amplifier stage 16, and the voltage variations across load resistors 61 and 62 in the input differential amplifier stage are applied in a differential manner to the output stage 16. Thus, any common mode signal, such as that arising from AGC variations, developed at the collectors of transistors 40 and 46 is rejected in the differential amplifier stage 16. The load resistors 61 and 62 are small valued so that amplifier stage 10 rolls off at approximately 100 MHz. The output stage 16 is connected in the Darlington manner described with emitter-follower transistors 82 and 84 buffering the inputs to transistors 86 and 88 to prevent the latter transistors from loading the first stage as the frequency is increased.

A differential output signal is derived at the output transformer 104. Transformer 104 has an input winding 108 thereon connected between collectors of transistors 86 and 88 and an output winding 106 to which output terminals 112 are connected. The Vcc collector voltage supply for the transistors shown in the circuit in FIG. 4 is available at voltage supply terminal 110, and thus voltage is connected through transformer winding 108 to the collectors of transistors 86 and 88.

The connection of the second or output stage 16 to the input stage 10 not only increases the overall gain of the amplifier circuit, but also eliminates variations in output impedance because the second stage operating point does not vary significantly with automatic gain control. The output of the gain control stage 10 is broadbanded by the use of relatively small valued load resistors 61 and 62 and by the use of emitter followers 82 and 84 in the Darlington connected output stage 16. In the absence of buffer transistors 82 and 84, the Miller capacitance of the high gain transistors 86 and 88 would react with the load resistors 61 and 62 to degrade the frequency response of the amplifier circuit. The emitter followers 82 and 84 have a high input impedance and therefore permit the use of larger load resistors 61 and 62 that would be the case without transistors 82 and 84.

Figure 5:
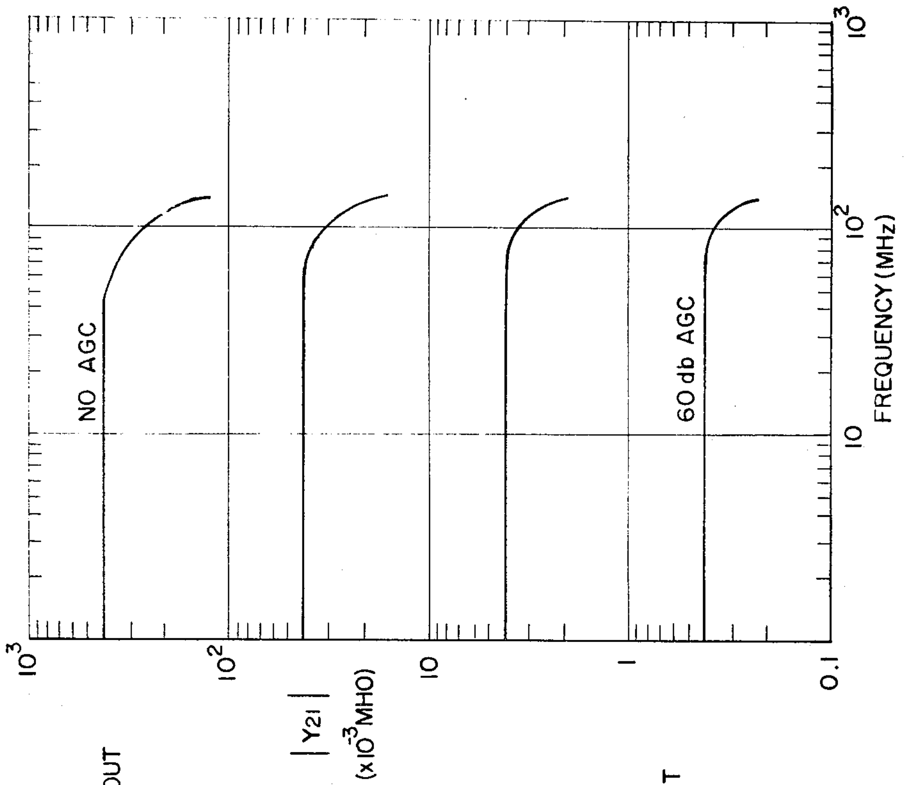
FIG. 5 is a graph illustrating the magnitude of the forward transfer admittance, $|Y_{21}|$, of the amplifier vs. the automatic gain control voltage, $V_{AGC}$, indicating that the amplifier bandwidth is constant as the amplifier gain is varied.

The magnitude of the overall transadmittance of the amplifier in FIG. 4 is essentially constant to approximately 50 megahertz as shown in FIG. 5. The magnitude of the forward transadmittance is the ratio of the output current and the input voltage with the output voltage equal to zero. It is used to indicate the range within which the amplifier will operate as a tuned amplifier.

The following table lists component values used in a circuit of the type described which was actually built and successfully tested. However, these values should not be construed as limiting the scope of this invention.

| COMPONENT | VALUE |
|---|---|
| Resistor (R) | |

| | |
|---|---|
| R51 | 5000 ohms |
| R53 | 5000 ohms |
| R55 | 2000 ohms |
| R57 | 8400 ohms |
| R61 | 470 ohms |
| R62 | 470 ohms |
| R70 | 66 ohms |
| R71 | 1470 ohms |
| R72 | 1100 ohms |
| R73 | 5530 ohms |
| R74 | 1100 ohms |
| R89 | 12100 ohms |
| R91 | 1860 ohms |
| R94 | 45 ohms |
| R96 | 200 ohms |
| R98 | 200 ohms |
| R100 | 2800 ohms |
| R102 | 2800 ohms |
| R114 | 1400 ohms |
| R115 | 200 ohms |
| R116 | 5600 ohms |
| Supply Voltage | |
| VCC | 12 volts |

Various modifications may be made in the above-described circuits without departing from the scope of this invention. For example, a resistor (not shown) may be added between the $V_{AGC}$ terminal 45 and node 43 at the bases of transistors 42 and 44. In some applications, it has been found desirable to use such a resistor to linearize the AGC voltage characteristic.

In addition, the input and output stages of the amplifier circuit may be modified so that the bases of input transistors 48 and 50 are directly coupled to a source of differential input signals. This would be an alternative connection for the particular type of input transformer coupling shown in FIG. 4.

Another modification to the above-described circuits and clearly within the scope of this invention is to add collector load resistors for the differentially coupled output transistors 86 and 88 and derive the output signal directly from these collector load resistors rather than use the transformer coupling 104 as shown in FIG. 4.

Various other modifications may be made in the circuit of FIG. 4, e.g., varying the resistor and transistor connections in the bias networks 12 and 14 to change the DC bias levels therein without departing from the scope of this invention. Accordingly, the present invention is limited only by way of the following appended claims.

We claim:

1. A differential amplifier circuit including, in combination:

a first differential amplifier stage including:

a first pair of transistors, each having control, first, and second electrodes, with the second electrodes being coupled to a first common point, first load impedance means coupling the first electrode of one transistor of the first pair to a source of operating potential, the first electrode of the other transistor of the first pair being coupled directly to said source of operating potential;

a first input transistor, having control, first and second electrodes, the first electrode of which is connected to said first common point, a second pair of transistors each having control, first, and second electrodes, with the second electrodes being coupled to a second common point, second load impedance means coupling the first electrode of one transistor of the second pair to said source of operating potential, the first electrode of the other transistor of the second pair being coupled directly to said source of operating potential;

a second input transistor, having control, first and second electrodes, the first electrode of which is connected to said second common point and the second electrode of which is further connected to the second electrode of said first input transistor, the control electrodes of said first and second input transistors being differentially coupled to input terminals for receiving thereat a differential input signal.

means for supplying a gain control voltage, the control electrodes of the one of the transistors of each of said first and second pairs of differentially coupled transistors being connected at a first common node, the control electrodes of the other of the transistors of each of said pairs of differentially coupled transistors being connected at a second common node for receiving at said common nodes said gain control voltage, said common nodes being a virtual ground and eliminating the need for RF bypass capacitors for said first and second pairs of transistors; and the output of said circuit being obtained across the first electrodes of the one of the transistors of the first and second pairs of transistors.

2. The differential amplifier circuit defined in claim 1 which further includes a second differential amplifier stage having at least first and second differentially coupled transistors therein which are coupled respectively to the first electrodes of the one transistor in each of said first and second transistor pairs, so that a common mode signal coupled to said first and second transistor pairs is rejected in said second stage because the differential conductivity in said second stage is unchanged by a common mode signal applied thereto.

3. The differential amplifier circuit defined in claim 2 wherein said second stage further includes third and fourth transistors cascaded to said first and second transistors in said second stage to form therewith a pair of Darlington connections, said third and fourth transistors interconnecting said first and second transistors in said second stage with the outputs of transistors in said first and second pairs of transistors in said first stage, said third and fourth transistors having a high input impedance for buffering the inputs to said first and second differentially connected transistors in said second stage and enhancing the frequency response of the amplifier circuit.

4. The differential amplifier circuit defined in claim 3 which further includes:

a first bias network connected to said first differential amplifier stage for setting the DC bias levels for said first and second transistor pairs and said first and second input transistors, a second bias stage connected to said second differential amplifier stage for establishing the bias levels thereat, and a current sink connected to said second differential amplifier stage for establishing a constant current therethrough.

5. A differential amplifier circuit adapted to be fabricated in monolithic integrated form and including, in combination:

a first differential amplifier stage having a first pair of transistors each having control, first and second electrodes, with the second electrodes being differentially coupled therein at a first common point, a second pair of transistors each having control, first and second electrodes, with the second electrodes being differentially coupled to a second common point, one transistor in each of said first and second pairs of transistors having a load resistor connected thereto, a first input transistor having control, first and second electrodes, with the first electrode being coupled to said first common point, a second input transistor having control, first and second electrodes, with the first electrode being coupled to said second common point with the second electrode thereof being further differentially coupled to the second electrode of said first input transistor, said first and second input transistors operative to receive differential signals at the control electrodes thereof and to differentially control the current flowing in said first and second pairs of transistors in said first differential amplifier stage, the control electrodes of the other transistor in each of said first and second pairs of transistors being connected to a common node to which an automatic gain control voltage is applied for controlling the DC level of current flow in said first and second load resistors, said common node having a virtual ground and thereby requiring no by-pass capacitors at said first and second pairs of differentially coupled transistors for said first stage to operate in a common base mode;

a second, output differential amplifier stage having at least first and second differentially coupled transistors therein from which an output signal may be derived, said first and second transistors in said output stage being differentially coupled to said first and second load resistors in said input stage whereby a common mode signal in said input stage does not affect the conductivity of said first and second transistors in said output stage; and third and fourth transistors cascaded to said first and second transistors, respectively, in said output stage and further interconnecting said first and second transistors in said output stage to said first and second load resistors in said input stage, said third and fourth transistors in said output stage having a high input impedance and low output impedance and enhancing the frequency response of the amplifier circuit.

6. The differential amplifier circuit as defined in claim 1 which further includes a first bias network connected between a voltage supply terminal and a point of reference potential having series resistors therein for establishing desired DC biasing levels at said first, input differential amplifier stage, said first bias network further having diodes connected in series with said resistors for providing temperature compensation at said input differential amplifier stage, said first bias network including cascaded transistors therein connected between said resistors and said load resistors in said input differential amplifier stage for preventing the collectors of said one transistor in each of said first and second pairs of transistors from rising to the supply voltage of said amplifier circuit, said first bias network further including another transistor connected between said cascaded transistors and said one transistor in each of said pairs of transistors for establishing the bias potential thereat, and a further transistor connected between said another transistor and said first and second input transistors for establishing the DC bias levels thereat.

7. The differential amplifier circuit defined in claim 6 which further includes a second bias network having resistors connected in series with temperature compensating diodes between a voltage supply terminal and a point of reference potential, and a current source connected between said first, second, third and fourth transistors in said output differential amplifier stage and a point of reference potential and further connected to a bias point in said second bias network, said current source providing a constant current through said output differential amplifier stage.

8. The differential amplifier circuit defined in claim 7 wherein said one transistor in each of said first and second pairs of transistors being connected to a common point, and a resistor connected between said last named common point and said common node to which the other transistor in each of said transistor pairs is connected.

* * * * *